United States Patent
Kikuchi

(10) Patent No.: US 6,797,527 B2
(45) Date of Patent: Sep. 28, 2004

(54) MANUFACTURING METHOD OF A PHASE SHIFT MASK, METHOD OF FORMING A RESIST PATTERN AND MANUFACTURING METHOD OF A SEMICONDUCTOR DEVICE

(75) Inventor: Koji Kikuchi, Kanagawa (JP)

(73) Assignee: Sony Corporation (JP)

( * ) Notice: Subject to any disclaimer, the term of this patent is extended or adjusted under 35 U.S.C. 154(b) by 135 days.

(21) Appl. No.: 09/939,773

(22) Filed: Aug. 28, 2001

(65) Prior Publication Data

US 2002/0034695 A1 Mar. 21, 2002

(30) Foreign Application Priority Data

Aug. 30, 2000 (JP) ..................................... P2000-261395

(51) Int. Cl.[7] .......................... H01L 31/26; H01L 21/66
(52) U.S. Cl. ....................... 438/14; 430/22; 356/237.1
(58) Field of Search ........................... 438/14; 430/22; 356/237.1

(56) References Cited

U.S. PATENT DOCUMENTS 6,391,501 B1 * 5/2002 Ohnuma ..................... 430/22
6,396,944 B1 * 5/2002 Kung .......................... 382/144

2002/0171825 A1 * 11/2002 Krantz et al. ............. 356/237.1

* cited by examiner

*Primary Examiner*—W. David Coleman
(74) *Attorney, Agent, or Firm*—Rader, Fishman & Grauer PLLC; Ronald P. Kananen

(57) ABSTRACT

When a Levenson phase-shift mask is manufactured, the relationship of optical conditions (numerical aperture, partial coherence factor, and others) of an optical system of an exposure device used for exposure and a mask structure (amount of excavation of a substrate, thickness of a phase shifter, or the like) with displacement of a pattern to be transferred by exposure is sought by simulation, and optical conditions and a mask structure that limit displacement of the pattern within a required range are selected, taking manufacturing errors of the mask into consideration. Then the selected optical conditions and mask structure are examined to determine whether they ensure a desired exposure tolerance and a desired focal depth, and this procedure is repeated until an acceptable result is obtained. Once an acceptable result is obtained, the optical conditions and the mask structure are employed to fix the exposure device to the determined optical conditions and actually start fabrication of the mask having the determined mask structure. Thereby, upon exposure using the phase-shift mask, displacement of the transfer pattern is minimized, which results in improvement of the transfer positional accuracy, while ensuring a lithography process tolerance.

8 Claims, 7 Drawing Sheets

MANUFACTURING METHOD OF A PHASE SHIFT MASK, METHOD OF FORMING A RESIST PATTERN AND MANUFACTURING METHOD OF A SEMICONDUCTOR DEVICE

BACKGROUND OF THE INVENTION

1. Field of the Invention

This invention relates to a manufacturing method of a phase-shift mask, a method of making a resist pattern and a manufacturing method of a semiconductor device, which are particularly suitable for use when manufacturing a so-called Levenson phase-shift mask, making a resist pattern using a Levenson phase-shift and manufacturing a semiconductor device, which makes a resist pattern by exposure using a Levenson phase-shift mask.

2. Description of Related Art

The lithography process used when manufacturing a semiconductor device, for example, is required to have a high resolution beyond the resolution limit determined by the wavelength of light used for exposure along with progressive miniaturization of patterns.

Recently, for the purpose of enabling fabrication of micro patterns as small as or smaller than the exposure wavelength, a technique has been developed, which uses a high-resolution exposure photo mask called a phase-shift mask, having the function of modulating the phase of transmission light and improving the resolution utilizing interference of light. There are some kinds of such phase-shift masks, e.g., Levenson-type masks, in which light passing mask apertures corresponding to adjacent mask patterns are opposite in phase, and half-tone-type masks whose light shielding portions have a permeability and in which light through the shielding portion is opposite in phase from light passing though a mask aperture. Among those, Levenson phase-shift masks have been used practically for manufacturing DRAM, high-speed LSI, and others, and they have been confirmed to be useful.

Levenson phase-shift masks are generally classified into substrate-excavation-type masks made by excavating a quartz substrate as the mask substrate to ensure that light transmitting mask apertures corresponding to adjacent mask patterns are opposite in phase, and phase-shifter-added-type masks using a phase shifter formed on a quartz substrate.

As one of the substrate-excavation-type Levenson phase-shift mask structures, there is a dual-trench structure. In the dual-trench structure, both of the regions where light passing therethrough becomes opposite in phase, namely, 0° and 180°, are excavated because, by excavating both regions of 0° and 180° in phase, the difference of contrast between transmission light having the phase of 0° and transmission light having the phase of 180° is small, and deviation upon pattern transfer can be prevented. A specific example of the substrate-excavation-type Levenson phase-shift mask structure is shown in FIG. 1. In FIG. 1, reference numeral 101 denotes a quartz substrate, 102 is a mask pattern, and 103 and 104 are excavated portions.

FIGS. 2 and 3 show specific examples of the phase-shifter-added-type Levenson phase-shift mask structure. FIG. 2 shows an overlying phase-shifter-added-type; and, FIG. 3 shows an underlying phase-shifter-added-type. In FIGS. 2 and 3, reference numeral 201 denotes a quartz substrate, 202 is a mask pattern, and 203 is the phase shifter.

In case of conducting exposure using the conventional Levenson phase-shift mask, transmission light with the phase of 0° and transmission light with the phase of 180° are different from each other in variation in contrast caused by the deviation of focal points (defocusing) that occurs upon exposure, and transfer displacement of the pattern occurs due to defocusing. Although a certain degree of defocusing may inevitably occur because of unevenness of the wafer surface for transferring the pattern to, various errors in the exposure device, manufacturing errors of the mask (for example, etching error produced upon excavation of the substrate), and so on, it is important to minimize pattern transfer displacement within an expected defocusing region.

Heretofore, however, no concrete measure for minimizing transfer displacement of the pattern has been proposed.

OBJECT AND SUMMARY OF THE INVENTION

It is, therefore, an object of the invention to provide a manufacturing method of a phase-shift mask, capable of minimizing the displacement of a transfer pattern while ensuring a lithography process tolerance when conducting exposure by using the phase-shift mask, and thereby capable of improving the transfer positional accuracy. Another subject of the invention to provide a method of making a resist pattern by exposure using the phase-shift mask, and a manufacturing method of a semiconductor device made by forming the resist pattern by exposure using the phase-shift mask.

According to the invention, there is provided a manufacturing method of a phase-shift mask, comprising:

seeking the relationship of optical conditions of an exposure optical system used for exposure and a mask structure with displacement of a pattern to be transferred by exposure;

finding the optical conditions and the mask structure that can limit displacement of the pattern within a required range, taking manufacturing errors of the mask into consideration;

examining the optical conditions and the mask structure obtained determine whether they ensure a required exposure tolerance and a required focal depth; and executing fabrication of such a mask to obtain the mask structure when the result of the examination is acceptable.

According to the invention, there is further provided a method of making a resist pattern through exposure using a phase-shift mask, comprising:

seeking the relationship of optical conditions of an exposure optical system used for exposure and a mask structure of the phase-shift mask with displacement of a pattern to be transferred by exposure;

finding the optical conditions and the mask structure that can limit displacement of the pattern within a required range, taking manufacturing errors of the mask into consideration;

examining the optical conditions and the mask structure obtained to determine whether they ensure a required exposure tolerance and a required focal depth; and when the result of the examination is acceptable, fixing the exposure optical system to the optical conditions selected, then actually manufacturing the phase-shift mask having the mask structure selected, and conducting exposure using the exposure optical system and the phase-shift mask.

According to the invention, there is further provided a manufacturing method of a semiconductor device having a step of making a resist pattern through exposure using a phase-shift mask;

seeking the relationship of optical conditions of an exposure optical system used for exposure and a mask structure of the phase-shift mask with displacement of a pattern to be transferred by exposure;

finding the optical conditions and the mask structure that can limit displacement of the pattern within a required range, taking manufacturing errors of the mask into consideration; examining the optical conditions and the mask structure obtained to determine whether they ensure a required exposure tolerance and a required focal depth; and when the result of the examination is acceptable, fixing the exposure optical system to the optical conditions selected, then actually manufacturing the phase-shift mask having the mask structure selected, and conducting exposure using the exposure optical system and the phase-shift mask.

The process of determining optical conditions of an exposure optical system and a mask structure in the present invention is outlined in the flowchart of FIG. 4.

Representative optical conditions of the exposure optical system are numerical aperture (NA) and partial coherence factor (σ). In exposure devices, in general, the value obtained by dividing the numerical aperture of an illumination optical system by the numerical aperture of the mask side of the projection optical system is called coherence. An intermediate value of such coherence (partial coherent illumination) between its value 0 (coherent illumination) and its value ∞ (incoherent illumination) is herein called the partial coherence factor.

The phase-shift mask is typically a Levenson phase-shift mask of any type of the substrate-excavation-type, as shown in FIG. 1, or of the phase-shifter-added-type, as shown in FIGS. 2 and 3. The mask structure in the former substrate-excavation-type Levenson phase-shift mask is regulated by the amount of excavation of the substrate, and displacement of the transfer pattern is minimized by optimizing the substrate excavation amount. The mask structure in the latter phase shifter-added Levenson phase-shift mask is regulated by the thickness of the phase shifter, and displacement of the transfer pattern is minimized by optimizing the thickness of the phase shifter.

In the case of the simplest pattern, like a uniform pattern in which a unit pattern is regularly arranged in equal intervals, determination of a pattern employed in FIG. 4 is determined by its design rule. On the other hand, in the case of a complicated, non-uniform pattern, like logical LSI, etc., the width and shape of the excavation, in case of a substrate-excavation-type Levenson phase-shift mask, or width and shape of the phase shifter, in case of a phase shifter-added Levenson phase-shift mask, also become complicated, and therefore, displacement of the transfer pattern and lithography process tolerance vary with the width and the shape. Therefore, it is necessary to optimize optical conditions and mask structure so as to prevent displacement over the entire pattern and to ensure lithography process tolerance. For this purpose, by grouping patterns that can be regarded as the same pattern configuration, optimizing optical conditions and mask structure for each group and establishing optical conditions and mask structure satisfying the strictest conditions, optical conditions and mask structure can be optimized for patterns in each group.

According to the invention having the above-summarized structure, by seeking optical conditions and a mask structure capable of limiting displacement of a pattern within a required range, taking manufacturing errors of the mask into consideration, and repeating this procedure until desired exposure tolerance and focal depth are obtained with such optical conditions and mask structure, it is possible to find optical conditions and a mask structure that are optimum to minimize pattern displacement while ensuring lithography process tolerance.

The above and other objects, features and advantage of the present invention will become readily apparent from the following detailed description thereof, which is to be read in connection with the accompanying drawings.

DESCRIPTION OF THE PREFERRED EMBODIMENTS

An embodiment of the invention is now explained below with reference to the drawings.

This embodiment will be explained as determining an appropriate amount of excavation of a substrate and a resultant phase difference by simulation, taking influences of the cross-sectional structure of the mask to exposure light into consideration in a substrate-excavation-type Levenson phase-shift mask. Here, a 0.26 μm-pitch Line and Space pattern is assumed as the mask pattern.

Figure 1:
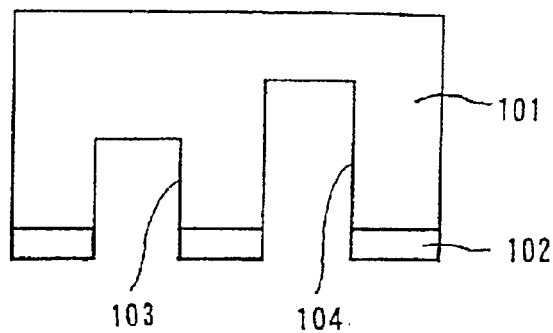
FIG. 1 is a cross-sectional view that shows a substrate-excavation-type Levenson phase-shift mask.
Figure 2:
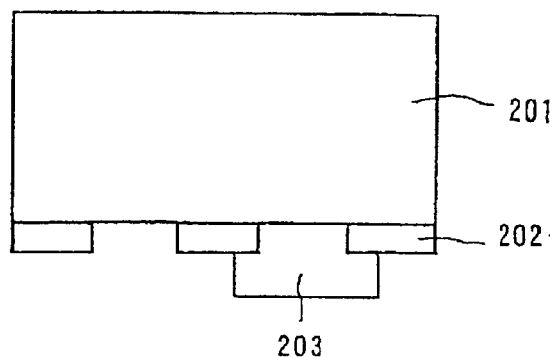
FIG. 2 is a cross-sectional view of a phase shifter-added Levenson phase-shift mask.
Figure 3:
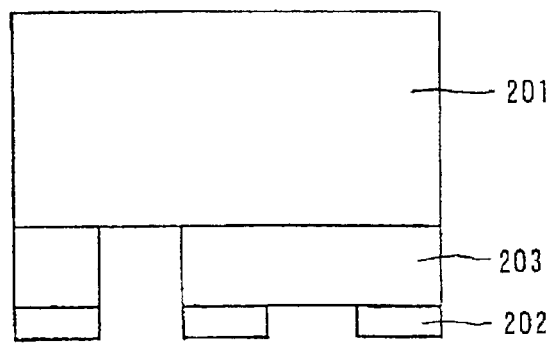
FIG. 3 is a cross-sectional view of a phase shifter-added Levenson phase-shift mask.
Figure 4:
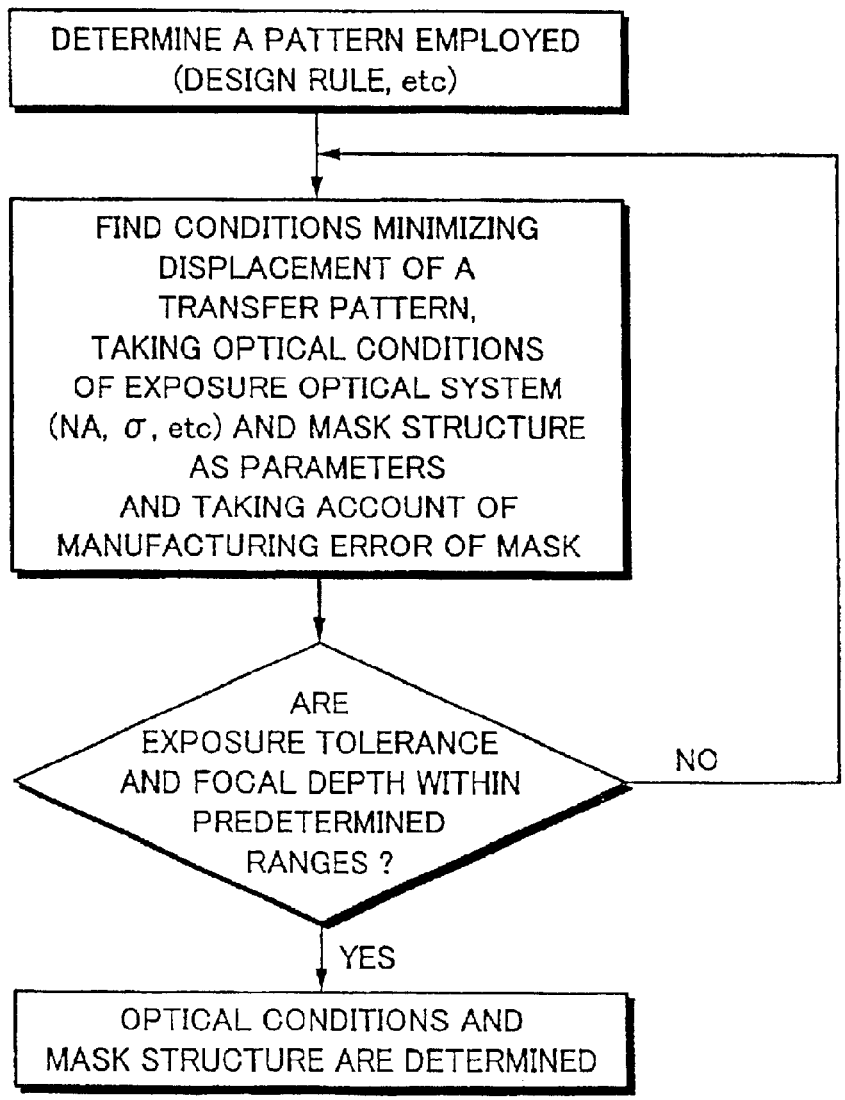
FIG. 4 is a flowchart that shows outline procedures for determining optical conditions of an exposure optical system and a mask structure.
Figure 5:
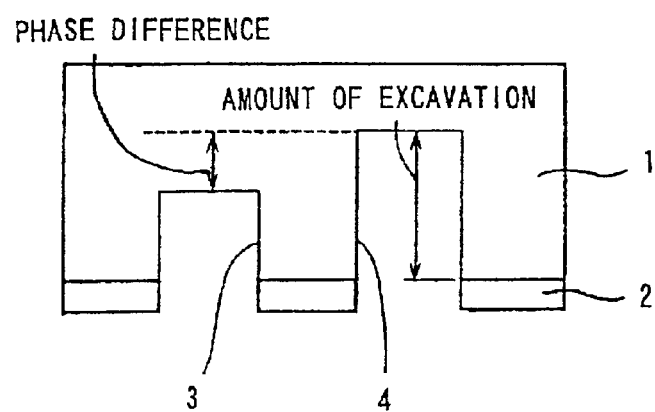
FIG. 5 is a cross-sectional view that shows a substrate-excavation-type Levenson phase-shift mask used in an embodiment of the invention.

FIG. 5 shows the structure of a substrate-excavation-type Levenson phase-shift mask by simulation. In FIG. 5, reference numeral 1 denotes a quartz substrate, 2 is a mask pattern made of a chromium (Cr) film, and 3 and 4 denote excavated portions. In this case, the excavated portion 4 is deeper than the excavated portion 3.

Figure 6:
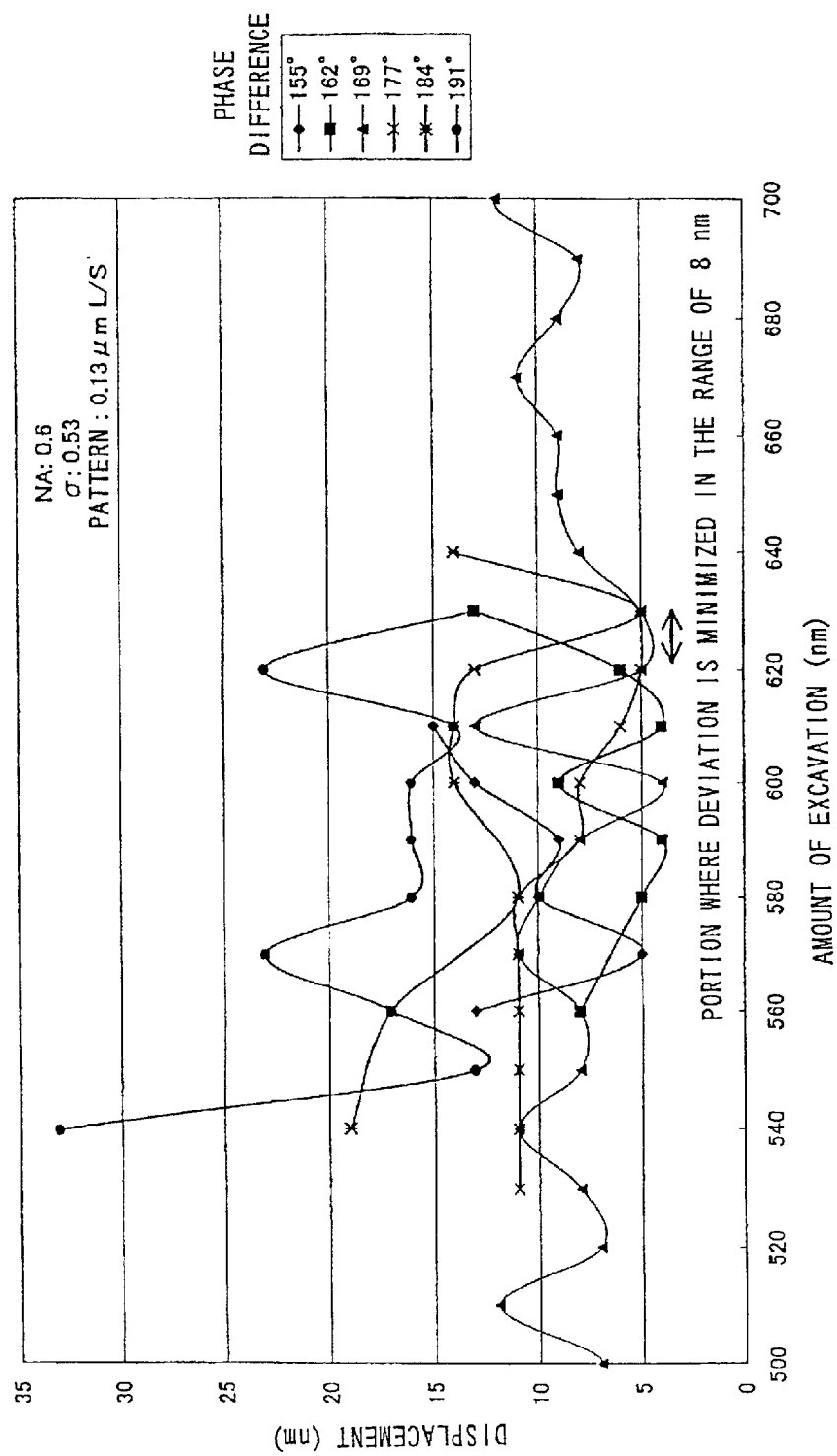
FIG. 6 is a schematic diagram that shows the result of a simulation executed with the embodiment of the invention.

FIG. 6 is the result of a simulation. In FIG. 6, the abscissa represents the amount of excavation of the deeper excavation 4 of FIG. 5, and the ordinate represents the amount of displacement of the transfer pattern in the case of the required focal depth being in the range from −0.3 to 0.3 μm. Simulation was conducted on five different levels of the difference in excavation amounts between the excavated portion 4 and the excavated portion 3. FIG. 6, however, represents the difference in excavation amounts by the phase difference. When the phase difference is φ(°), the wavelength of light used for exposure is λ (nm) and the refractive index of the glass portion is 1.51, the difference in excavation amount can be expressed as (φ/360×λ+(1.51−1) (nm). Used as the exposure device was a KrF scanner with a numerical aperture NA−0.60 and a partial coherence factor σ−0.53. In this case, λ=248.

Quartz substrate etching devices used in the 0.13 μm rule generation are expected to have etching errors of ±4 nm in a 5-inch size mask surface. Therefore, in FIG. 6, displacement must be limited within the range of 8 nm of the abscissa. Referring to FIG. 6, to satisfy this requirement, it is apparently sufficient to fix the amount of excavation of the deeper excavated portion 4 to 620 nm, remarking the curve for the phase difference of 169°, and in this case, the amount of excavation of the shallower excavated portion 3 is (169/

360)×248÷(1.51−1) 230 nm. It is known from this that, for minimizing the displacement of the transfer pattern, 620 nm as the amount of excavation of the excavated portion 4 and 390 nm as the amount of excavation of the excavated portion 3 are the best values.

Figure 7:
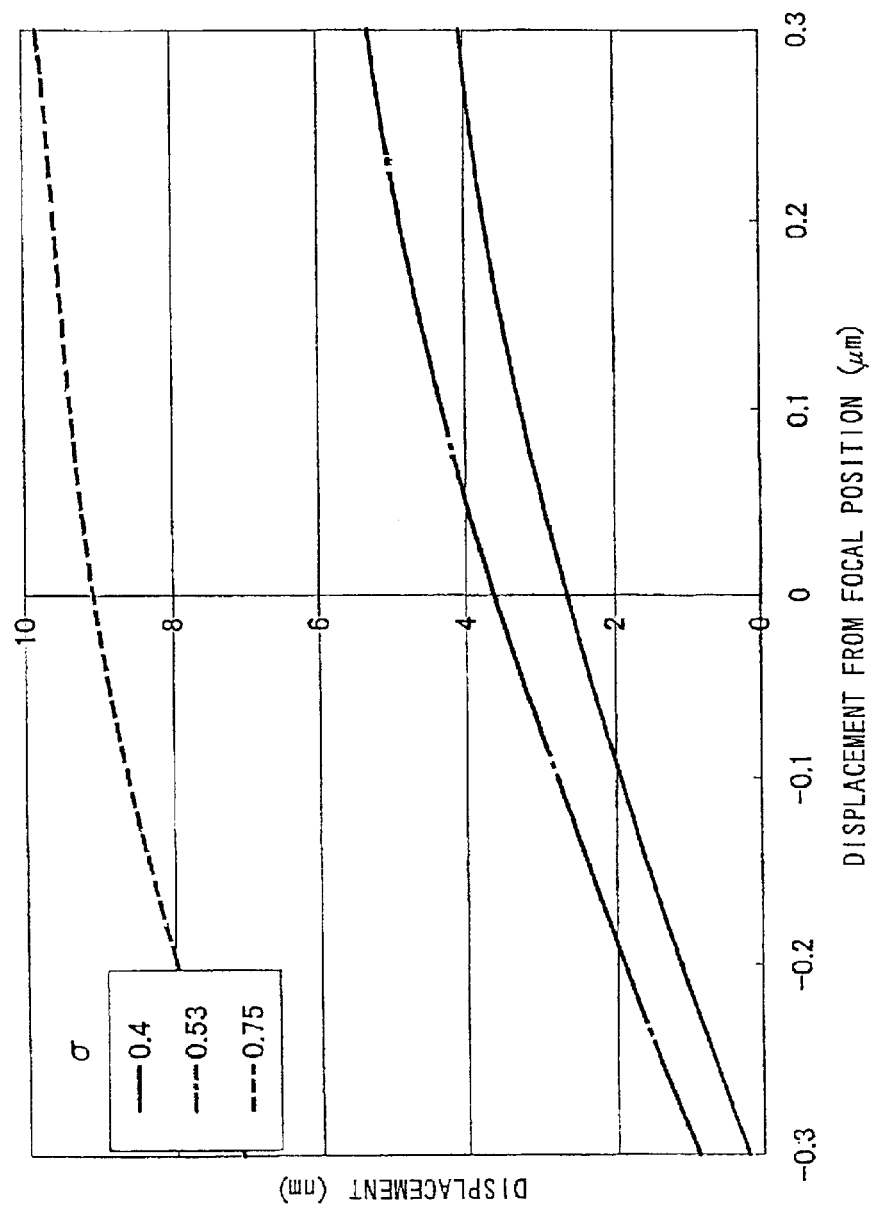
FIG. 7 is a schematic diagram that shows the result of a simulation executed with the embodiment of the invention.

FIG. 7 shows the relationship between the partial coherence factor σ and displacement within the required focal depth range. σ a was tried in three different levels. It is known from FIG. 7 that displacement tends to decrease as σ decreases, and displacement is minimum when σ=0.4. Therefore, the partial coherence factor σ of the exposure optical system of the exposure device employed is fixed to 0.4.

Figure 8:
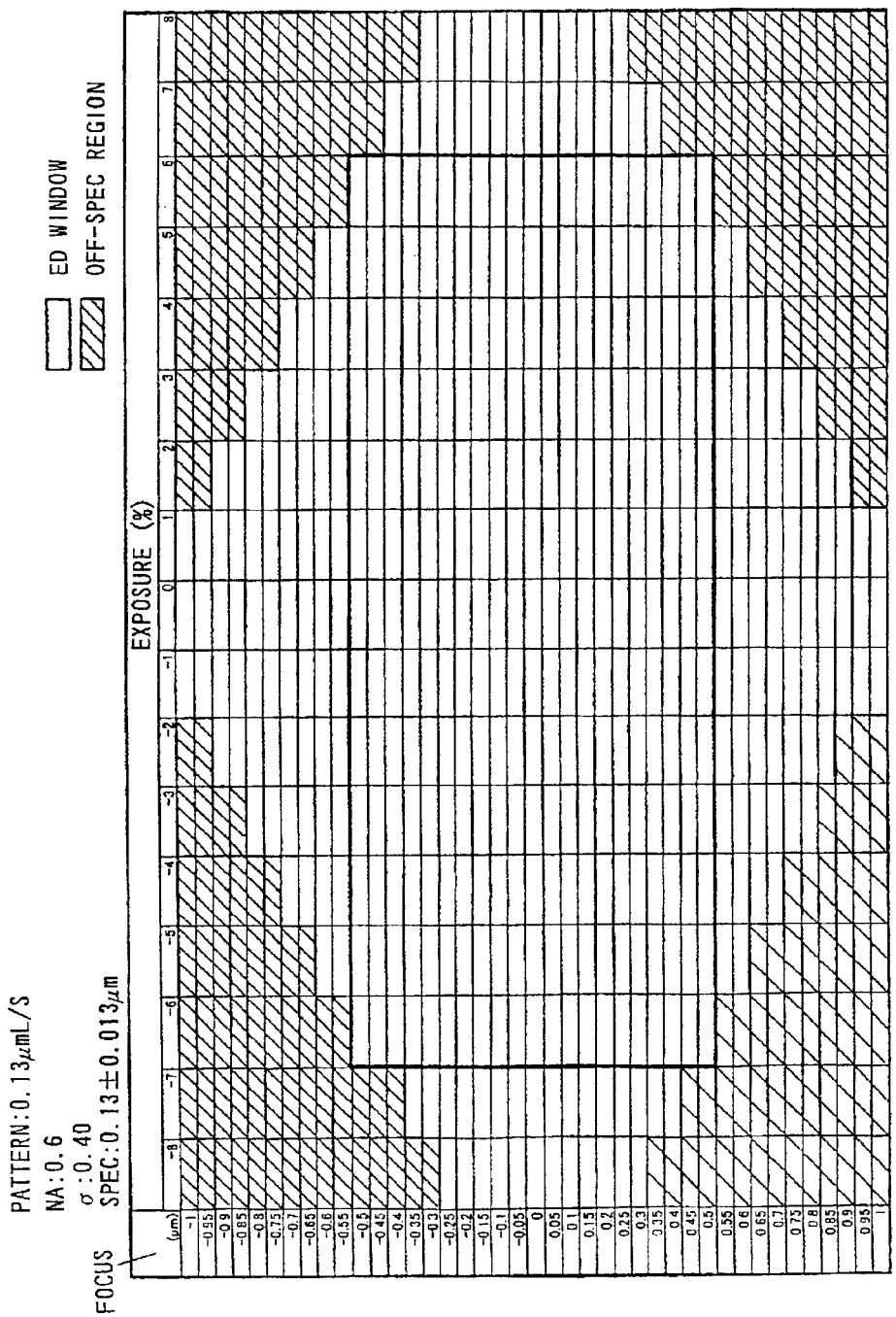
FIG. 8 is a schematic diagram that shows an ED window after optimization of optical conditions of the exposure device and the mask structure in the embodiment of the invention.

FIG. 8 shows a window of luminous exposure tolerance and focal depth tolerance obtained when the mask structure of the substrate-excavation-type Levenson phase-shift mask and optical conditions (NA, σ and so on) of the exposure device are optimized in the above-explained manner. It is known from FIG. 8 that an exposure tolerance of 12% and a focal depth of 0.95 μm are obtained; and, a lithography process tolerance acceptable for mass production is obtained.

Figure 9A:
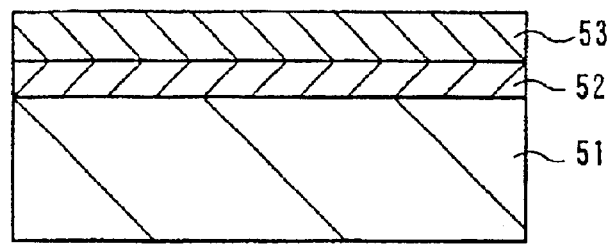
FIGS. 9A through 9C are cross-sectional views showing a process of making a pattern in the embodiment of the invention.
Figure 9B:
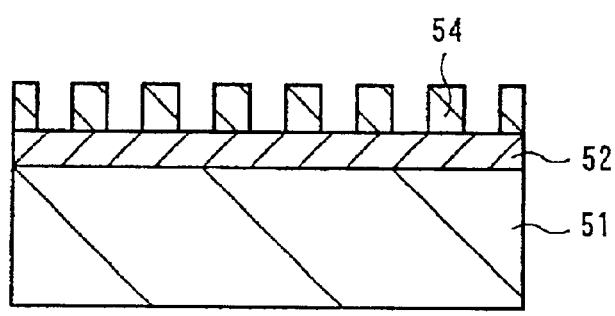
Figure 9C:
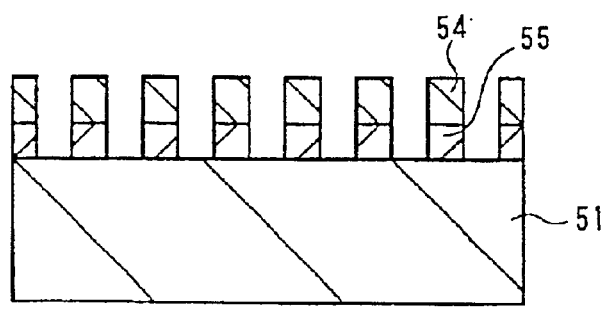

FIGS. 9A through 9C show an example in which the lithography process according to the embodiment is applied to the formation of a gate electrode of DRAM. That is, as shown in FIG. 9A, a conductive layer 52 as a gate electrode material is formed on a silicon substrate 51 prepared by a forming device isolating regions and a gate oxide film (not shown) on the surface of active region, and a resist 53 is coated thereon. Subsequently, the resist 53 undergoes exposure using a substrate-excavation-type Levenson phase-shift mask having an optimized mask structure and an exposure device optimized in optical condition (NA, σ and others). There follows development to make out the resist patter 54, as shown in FIG. 9B.

Thereafter, by etching the conductive layer 52 by reactive ion etching (RIE) using the resist pattern 54 as the mask, the gate electrode 55 is obtained, as shown in FIG. 9C.

As explained above, according to the embodiment, by exposure using the substrate-excavation-type Levenson phase-shift mask optimized in mask structure, i.e., in amount of excavation of the excavated portion, and the exposure device optimized in optical conditions (NA, σ and others), displacement of the transfer pattern can be minimized to attain a high transfer positional accuracy while ensuring a sufficient lithography process tolerance. Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention, as defined in the appended claims.

For example, although the embodiment has been explained as applying the invention to the fabrication of a 0.26 μm pitch Line and Space pattern, the design rule is not limited to this, and the invention is applicable to the formation of a complicated pattern, such as logical LSI pattern as well.

Further, although the foregoing embodiment uses the quartz substrate as the mask substrate, any appropriate substrate other than the quartz substrate may be used as the mask substrate.

As described above, according to the invention, displacement of the transfer pattern can be minimized to attain a high transfer positional accuracy while ensuring a sufficient lithography process tolerance when conducting exposure using a Levenson phase-shift mask. Additionally, by conducting exposure using a phase-shift mask manufactured in that manner, a resist patter with a high positional accuracy can be made.

What is claimed is:

1. A manufacturing method of a phase-shift mask, comprising:

seeking a relationship of optical conditions of an exposure optical system used for exposure and a mask structure with displacement of a pattern to be transferred by exposure;

finding said optical conditions and said mask structure that limit displacement of said pattern within a required range, taking manufacturing errors of the mask into consideration;

examining the optical conditions and the mask structure obtained to determine whether they ensure a required exposure tolerance and a required focal depth; and executing fabrication of such a mask to obtain said mask structure when the result of the examination is acceptable; wherein said optical conditions include, at least, a numerical aperture and a partial coherence factor.

2. The manufacturing method of a phase-shift mask according to claim 1 wherein said phase-shift mask is a Levenson phase-shift mask.

3. The manufacturing method of a phase-shift mask according to claim 2 wherein said Levenson phase-shift mask is of a substrate-excavation-type, and said mask structure is regulated by the amount of excavation of a substrate.

4. The manufacturing method of a phase-shift mask according to claim 1 wherein said Levenson phase-shift mask is of a phase-shifter-added-type, and said mask structure is regulated by the thickness of a phase shifter.

5. A method of making a resist pattern through exposure using a phase-shift mask, comprising:

seeking a relationship of optical conditions of an exposure optical system used for exposure and a mask structure of said phase-shift mask with displacement of a pattern to be transferred by exposure;

finding said optical conditions and said mask structure that limit displacement of said pattern within a required range, taking manufacturing errors of the mask into consideration;

examining the optical conditions and the mask structure obtained to determine whether they ensure a required exposure tolerance and a required focal depth; and when the result of the examination is acceptable, fixing said exposure optical system to the optical conditions selected, then actually manufacturing said phase-shift mask having the mask structure selected, and conducting exposure using said exposure optical system and said phase-shift mask; wherein said optical conditions include, at least, a numerical aperture and a partial coherence factor.

6. The method of making a resist pattern according to claim 5 wherein said phase-shift mask is a Levenson phase-shift mask.

7. The method of making a resist pattern according to claim 6 wherein said Levenson phase-shift mask is of a substrate-excavation-type, and said mask structure is regulated by the amount of excavation of a substrate.

8. The method of making a resist pattern according to claim 6 wherein said Levenson phase-shift mask is of a phase-shifter-added-type, and said mask structure is regulated by the thickness of a phase shifter.

* * * * *